US012800667B2

(12) United States Patent
Zhang

(10) Patent No.: US 12,800,667 B2
(45) Date of Patent: Nov. 17, 2026

(54) ANALYZER AND METHOD FOR DETERMINING SELF-DISCHARGE OF BATTERIES

(71) Applicant: Chaojiong Zhang, College Station, TX (US)

(72) Inventor: Chaojiong Zhang, College Station, TX (US)

( * ) Notice: Subject to any disclaimer, the term of this patent is extended or adjusted under 35 U.S.C. 154(b) by 0 days.

(21) Appl. No.: 18/725,755

(22) PCT Filed: Nov. 28, 2023

(86) PCT No.: PCT/US2023/081285

§ 371 (c)(1),
(2) Date: Jun. 29, 2024

(87) PCT Pub. No.: WO2024/129355

PCT Pub. Date: Jun. 20, 2024

(65) Prior Publication Data

US 2025/0290991 A1 Sep. 18, 2025

Related U.S. Application Data

(60) Provisional application No. 63/531,820, filed on Aug. 10, 2023, provisional application No. 63/456,574, (Continued)

(51) Int. Cl.
*G01R 31/382* (2019.01)
*G01R 19/10* (2006.01)
(Continued)

(52) U.S. Cl.
CPC ........... *G01R 31/386* (2019.01); *G01R 19/10* (2013.01); *G01R 19/12* (2013.01); *G01R 31/396* (2019.01)

(58) Field of Classification Search
CPC .. G01R 31/386; G01R 31/396; G01R 31/382; G01R 31/52; G01R 19/10; G01R 19/12; G01R 19/16542
See application file for complete search history.

(56) References Cited

U.S. PATENT DOCUMENTS 5,966,014 A 10/1999 Zhang et al.
6,291,972 B1 9/2001 Zhang
(Continued)

OTHER PUBLICATIONS

International Search Report and Written Opinion of the International Searching Authority dated Apr. 4, 2024 for corresponding International Application No. PCT/US2023/081285.

*Primary Examiner* — Dominic E Hawkins
(74) *Attorney, Agent, or Firm* — Stephen S. Hodgson

(57) ABSTRACT

A differential battery analyzer (DBA) for testing a battery includes a control circuit configured to apply a controllable current to a normal battery as a standard battery inside the DBA and includes two terminals (IOH) and (IOL) for connecting a battery under test therebetween. The current through the standard battery is controlled to be equal to its self-discharge current, whereby the voltage of the standard battery is kept constant at its open-circuit voltage. The terminal (IOH) is connected to an end of a branch where the standard battery is located, and the voltage between the terminal (IOH) and the terminal (IOL) is kept at a constant value approximately equal to the voltage of the standard battery within a desired precision range, and the terminal (IOL) is connected to the other end of the branch.

32 Claims, 8 Drawing Sheets

Related U.S. Application Data filed on Apr. 3, 2023, provisional application No. 63/431,721, filed on Dec. 11, 2022.

(51) Int. Cl.

| | |
|---|---|
| ***G01R 19/12*** | (2006.01) |
| ***G01R 31/385*** | (2019.01) |
| ***G01R 31/396*** | (2019.01) |

(56) References Cited

U.S. PATENT DOCUMENTS

| | | | | |
|---|---|---|---|---|
| 8,541,986 | B2 * | 9/2013 | Hiraoka | H01M 10/0525 320/162 |
| 11,346,891 | B2 * | 5/2022 | Gorrachategui | G01R 31/392 |
| 12,181,503 | B1 * | 12/2024 | Chen | H01M 10/482 |
| 12,455,323 | B2 * | 10/2025 | Kim | G01R 31/367 |
| 2008/0166627 | A1 * | 7/2008 | Mori | H01M 10/44 429/61 |
| 2018/0149707 | A1 * | 5/2018 | Sheng | H01M 10/48 |
| 2019/0094307 | A1 * | 3/2019 | Brebant | G01R 31/3648 |
| 2022/0268852 | A1 | 8/2022 | Zhang | |
| 2023/0411711 | A1 * | 12/2023 | Feng | G01R 31/385 |
| 2024/0110987 | A1 * | 4/2024 | Tang | G01R 31/3835 |

* cited by examiner

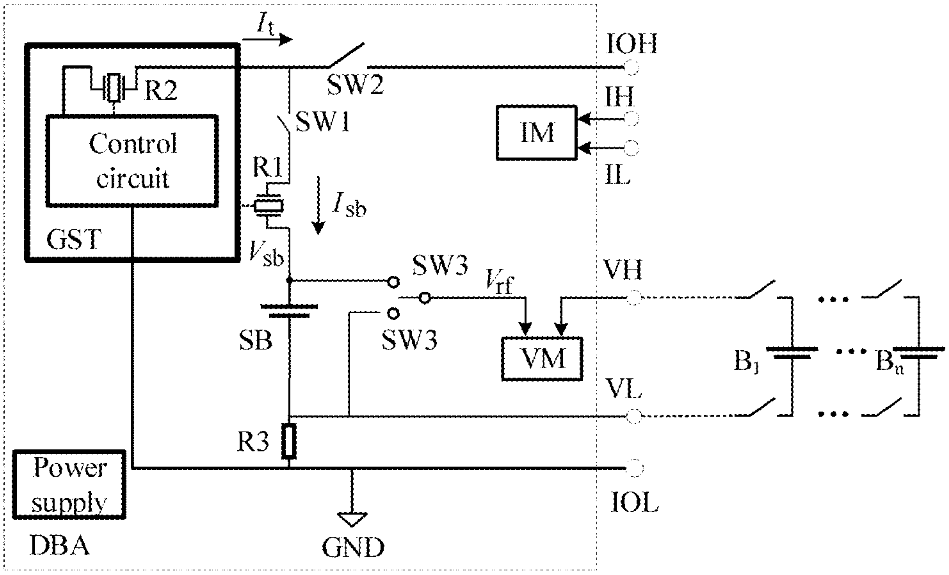
Fig. 8
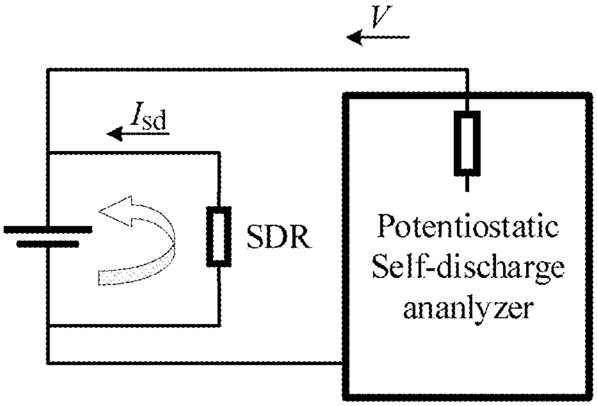
Fig. 9-- Prior Art --
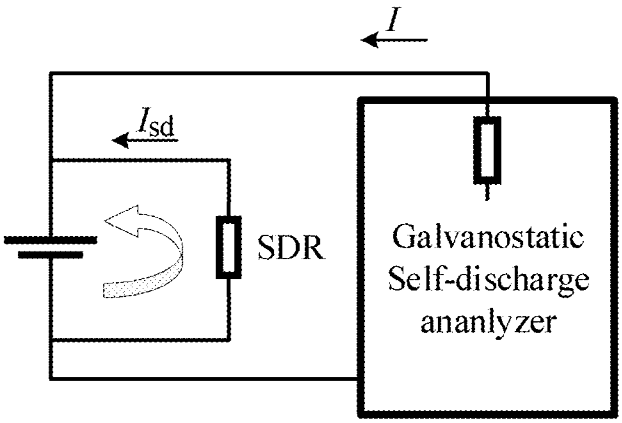
Fig. 10

ANALYZER AND METHOD FOR DETERMINING SELF-DISCHARGE OF BATTERIES

CROSS-REFERENCE TO RELATED APPLICATIONS

This is a national-stage application of International Application No. PCT/US2023/129355 filed on 28 Nov. 2023, which was published as International Pub. No. WO 2024/055618 A1, which claims priority to U.S. Provisional Patent Application Nos. 63/431,721, filed 11 Dec. 2022, 63/456,574, filed 3 Apr. 2023, and 63/531,820, filed Aug. 10, 2023, each of which is incorporated by reference in its entirety for all purposes. This application is related to the present inventor's International Patent Application No. PCT/US2020/062548 A2 filed on 30 Nov. 2020, which was published as International Patent Application Pub. No. 2021/113161 A2 and titled "System for Forming and Testing Batteries in Parallel and in Series," which is incorporated by reference in its entirety for all purposes. This application is also related to the present inventor's International Patent Application No. PCT/US2022/021643 filed on 24 Mar. 2022, which was published as International Pub. No. WO 2023/027766 A1 and titled "System for Determining Battery Parameters," and which is incorporated by reference in its entirety for all purposes.

BACKGROUND OF THE INVENTION

1. Field of the Invention

This patent application pertains to forming, testing and sorting batteries, particularly to high precision, high speed and low cost battery testing technology and to an analyzer using a regular rechargeable battery as a standard battery for differential voltage measurement, and more particularly to measuring self-discharge, open-circuit voltage and direct current internal resistance of batteries.

2. Description of the Related Art

One of the important characteristics of a battery is its leakage current or self-discharge current. Leakage current is affected by battery quality, state of charge and temperature. One method for measuring leakage current is to hold a battery at a constant voltage and measure a charging current when the current is stabilized to a constant value. A Self-Discharge Analyzer from Keysight Technologies, Inc. is believed to use this method. This method requires very expensive equipment and still may take a long time for the measurement, such as a few hours. A voltage sourcing stability of 3 μV peak may cause a disturbance of the battery's electrochemical system and make it difficult to get real leakage current. It is further believed that Keysight's Self-Discharge Analyzer requires one channel per battery.

An indirect method is to measure a voltage drop of a battery at open circuit over a period of time. This method may take a very long time (several days or even weeks) to do and still does not provide a leakage current value, but it is popular among battery manufacturers because it does not require expensive equipment. This method assumes that capacitance of all cells is the same within a tolerable precision.

It is desired to have a method that can measure self-discharge (SD), open circuit voltage (OCV) and direct current internal resistance (DCIR) of batteries quickly, precisely and at a reasonable cost for making batteries and for battery research.

SUMMARY OF THE INVENTION

In one aspect, this disclosure is directed to a differential battery analyzer (DBA) for testing a battery. The DBA comprises a control circuit configured to apply a controllable current to a normal battery as a standard battery (SB) inside the DBA, wherein the current through the SB ($I_{sb}$) is controlled to be equal to its self-discharge current, whereby the voltage of the SB is kept constant at its open-circuit voltage (OCV); and two terminals (IOH) and (IOL) for connecting a battery under test therebetween, wherein the terminal (IOH) is connected to an end of a branch where the SB is located, and the voltage between the terminal (IOH) and the terminal (IOL) is kept at a constant value approximately equal to the voltage of the SB within a desired precision, and the terminal IOL is connected to the other end of the branch.

In one illustrative embodiment, the DBA further comprises a first current sensor connected to the SB in series for measuring the current through the SB and providing feedback to control an output current (It) from the control circuit, and/or a second current sensor for measuring an output current from the control circuit and providing feedback to control the output current. Alternatively, the current flowing to the terminal (IOH) (lo) is following to maintain the potential of the terminal (IOH) when a battery is connected to the DBA via the terminals (IOH) and (IOL), wherein $I_t = I_O + I_{sb}$.

In one illustrative embodiment, the DBA further comprises another two terminals (VH) and (VL) and a circuit block for voltage measurement (VM) for measuring differential voltage between a reference voltage and the voltage of the battery under test which is connected to the DBA via the terminals (VH) and (VL), wherein the reference voltage is determined on the basis of the voltage of the SB. Alternatively, the reference voltage is selected as one of a plurality of reference voltages within a range not greater than the value of the voltage of the SB. Alternatively, the DBA further comprises a plurality of resistors connected serially with each other and in parallel with the branch where the SB is located, wherein each resistor has its respective reference voltage output terminal which is selected via a multiplexer connected to the VM, whereby the voltage of the SB is divided into a plurality of reference voltages.

In one embodiment, the normal battery includes a secondary rechargeable battery. In another embodiment, the normal battery has the same type as the battery under test. The DBA preferably further comprises another two terminals (IH) and (IL) connected to a circuit block for current measurement (IM).

In another aspect, the disclosure is directed to a method for measuring differential voltage. The method comprises the steps of: using the DBA above to measure a differential voltage representing a difference between the reference voltage and the voltage of the terminal (VH) by means of the VM, wherein a battery under test is connected to the terminals (VH) and (VL). Alternatively, the battery under test includes a group of batteries connected in parallel.

In yet another aspect, the disclosure is directed to a galvanostatic method for measuring self-discharge current ($I_{sd}$) of a battery. The method comprises the steps of: giving small currents $I_1$ and $I_2$ to a battery under test; measuring $(dV/dt)_1$ at $I_1$ and $(dV/dt)_2$ at $I_2$; calculating self-discharge current $I_{sd}$ and dynamic capacitance (DNC) of the battery under test by solving the two equations: $(dV/dt)_1*DNC=I_1+I_{sd}$, and $(dV/dt)_2*DNC=I_2+I_{sd}$.

In one embodiment, the galvanostatic method can be realized using a DBA described above. In another embodiment, the galvanostatic method can be used to measure self-discharge current ($I_{sd}$) of a battery or a group of batteries using a DBA described above.

In still another aspect, the disclosure is directed to another method for measuring self-discharge current ($I_{sd}$) of a group of batteries using a DBA described above. The method comprises the steps of: using the control circuit inside the DBA above to control the current through the SB to be equivalent to the current $I_{sd}$ thereof to keep the voltage of the SB constant, wherein the group of batteries are connected in parallel to the DBA via the terminals (IOH) and (IOL), and the current $I_{sd}$ of the battery SB is determined using the galvanostatic method above; allowing enough time for the group of batteries to reach balance status; and measuring current through each battery, whereby the value of the self-discharge current $I_{sd}$ of each battery is determined as being equal to the value of the current passed through the battery.

In another aspect, the disclosure is directed to a passive method for measuring self-discharge current ($I_{sd}$) of batteries in a group that are connected in parallel. The method comprises the steps of: allowing enough time for a group of batteries being tested to reach balance status, and measuring current through each battery, wherein the group of batteries are connected in parallel with each other, but without connecting to any power supply to keep the group of batteries in open circuit; and calculating self-discharge current of each battery ($I_{sd}$ #) from the equation: $I_{sd}$ #=$AI_{sd}$−$I_b$ #on the assumption that a difference of DNC of all batteries in the group can be ignored in calculation of self-discharge current and $AI_{sd}$ is known, wherein $AI_{sd}$ represents an average self-discharge current of the group of batteries, and $I_b$ #represents the current through the corresponding battery #.

In one illustrative embodiment, the average self-discharge current of the group of batteries is determined as a ratio of total self-discharge current of the group of batteries to the number of the batteries in the group being tested, wherein the group of batteries is regarded as an equivalent battery in calculation of total self-discharge current, wherein the total self-discharge current is determined using a galvanostatic method described above.

In yet another aspect, the disclosure is directed to a method for evaluating self-discharge of a battery. The method comprises the steps of: using the DBA above to measure a first differential OCV (DOCV1) and a second differential OCV (DOCV2) against the standard battery (SB) representing a difference between the reference voltage and the voltage of the terminal (VH) at two different times T1 and T2, wherein the battery being tested is connected to the terminals (VH) and (VL), wherein the DBA further comprises a first current sensor connected to the SB in series for measuring the current through the SB and providing feedback to control an output current from the control circuit, and wherein the current through the SB is controlled to be equal to self-discharge current of the SB, whereby the voltage of the SB is kept constant at its open-circuit voltage (OCV); calculating a differential DOCV (ΔDOCV) between two differential OCVs for a period from T1 to T2 (Δt); and evaluating, on the basis of a ratio of ΔDOCV to Δt, the self-discharge status of the battery being tested.

In one illustrative embodiment, the battery being tested includes a group of batteries connected in parallel, and the method further comprises the steps of: sorting the group of batteries according to the self-discharge status. Alternatively, the method further comprises calculating, on the basis of known dynamic capacitance (DNC) value of one or more batteries in the group or average DNC value of the group of batteries, self-discharge current ($I_{sd}$) of one or more batteries in the group. Alternatively, the average DNC value of the group of batteries is determined as a ratio of total DNC (TDNC) of the group of batteries to the number of the batteries in the group being tested, wherein the group of batteries is regarded as an equivalent battery in calculation of TDNC, wherein the DNC value of one or more batteries in the group or TDNC of the group of batteries is determined using a galvanostatic method described above.

In still another aspect, the disclosure is directed to a method for measuring direct current internal resistance (DCIR) of a battery. The method comprises the steps of: applying a first current and a second current to a battery being tested at two different times T1 and T2, wherein a battery being tested is connected to the DBA above via terminals (VH) and (VL), wherein the DBA further comprises two terminals (IH) and (IL) connected to a circuit block for current measurement (IM), wherein a sensor is connected between terminals (IH) and (IL) and connected with the battery in series for measuring the current through the battery; measuring a differential current (ΔI) representing a difference between a first measured current and a second measured current of the battery for a period from T1 to T2 by means of the IM; measuring a first differential voltage and a second differential voltage representing a difference between the reference voltage and the voltage of the terminal (VH) while applying the first current and the second current respectively by means of the VM; calculating a change of differential voltage (AV) of the battery representing the difference between the first differential voltage and the second differential voltage for a period from T1 to T2; and calculating the DCIR of the battery being tested as equal to ΔV/AI.

In another aspect, the disclosure is directed to an auto analyzer for evaluating batteries. The auto analyzer for evaluating batteries comprises a power supply, one or more processors and one or more storage media storing instructions executable by the one or more processors, wherein the instructions, when executed, cause the auto analyzer to perform operations according to any one of the methods described above.

This summary is provided to introduce a selection of concepts in a simplified form that are further described herein in a detailed description. This summary is not intended to identify key factors or essential features of the claimed subject matter, nor is it intended to be used to limit the scope of the claimed subject matter. These and other features and advantages of the present invention will be described in, or will become apparent to those of ordinary skill in the art in view of, the following detailed description of example embodiments of the present invention.

BRIEF DESCRIPTION OF THE DRAWINGS

These and other features of the disclosure will now be described with reference to drawings summarized below. The drawings and the associated description are provided to illustrate example embodiments of the disclosure and are not intended to limit the scope of the disclosure.

FIG. 8 is an illustrative circuit for measuring differential voltage using the DBA, according to the present disclosure.

FIG. 9 is an illustrative circuit for measuring $I_{sd}$ by applying constant voltage equal to the OCV of the battery, which is called a potentiostatic method. This method is believed to be used by Keysight's Self-Discharge Analyzer.

FIG. 10 is an illustrative circuit for measuring $I_{sd}$ by applying constant current to the battery, according to the present disclosure.

DETAILED DESCRIPTION OF THE EXEMPLARY EMBODIMENTS

Terminology used herein includes:

OCV: Open-circuit voltage of a battery

R: Resistor

SDR: self-discharge resistance

SB: Standard battery, which can maintain a constant voltage over a very long time to serve as a reference voltage.

IM: circuit block for current measurement.

VM: circuit block for voltage measurement.

Figure 1:
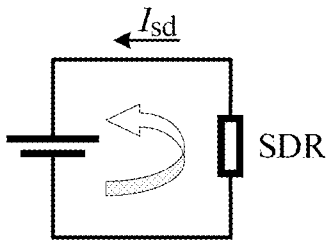
FIG. 1 is a simple equivalent circuit of a battery for self-discharge current ($I_{sd}$). For a small voltage range, OCV drop rate dV/dt is proportional to $I_{sd}$.

$I_t$, $I_O$, $I_{sb}$, $I_b$ #, IH, IL, IOH, IOL: I represents current $V_{sb}$, VH, VL: V represents voltage $V_{rf}$: reference voltage $I_{sd}$: self-discharge current $AI_{sd}$: average self-discharge current of a group of batteries DBA: Differential battery analyzer UDBA: Universal differential battery analyzer GST: Galvanostat to provide controlled current output PST: Potentiostat to provide controlled voltage output SW #: switch Mux: multiplexer FIG. 1 illustrates a simple equivalent circuit of a battery for self-discharge current ($I_{sd}$) according to aspects of the present disclosure. As shown in FIG. 1, for a small voltage range, OCV drop rate dV/dt is proportional to $I_{sd}$, where $I_{sd}$ is usually a negative value.

Figure 2:
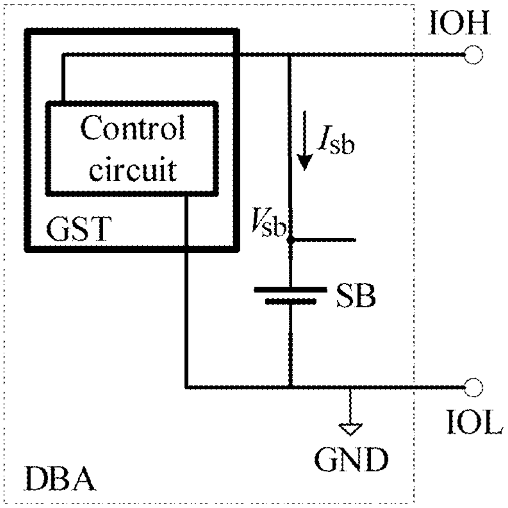
FIG. 2 is a block diagram of an example differential battery analyzer (DBA), according to the present disclosure.

FIG. 2 is a block diagram showing an example differential battery analyzer (DBA), according to the present disclosure. The DBA provides a reference voltage using a normal battery as a standard battery (SB). In this DBA, a control circuit configured to apply a controllable current is connected to a normal battery. A battery under test may be connected between terminals (IOH) and (IOL) of the DBA. In this DBA, the terminal (IOH) is connected to an end of a branch where the SB is located and the terminal (IOL) is connected to the other end of the branch. When the current through the normal battery (denoted as $I_{sd}$) is controlled to make $I_{sd}$ equal to self-discharge current (denoted as $I_{sd}$) of the SB, the voltage of the SB (denoted as $V_{sb}$) will be kept constant at its open-circuit voltage (OCV), whereby the voltage between the terminal (IOH) and the terminal (IOL) will be kept at a constant value approximately equal to the voltage $V_{sb}$ within a desired precision. It can be seen that the use of the constant current method or galvanostatic method described herein to maintain the voltage of the standard battery and the voltage of the battery under test, is different from a potentiostatic (i.e. constant voltage) method of the prior art. The galvanostatic method has the advantages of low noise, low ripple, insensitivity to temperature changes, and little change in the SOC (State of Charge) and OCV of the battery.

In some examples, a control circuit configured to apply a controllable current may include a GST. In such examples, the output current from the GST is controlled via a control unit therein on the basis of feedback from current sensor (eg. R1, R2). In some examples, such battery under test may include a group of batteries connected in parallel. The DBA described herein can maintain the standard battery voltage by making the controllable current through the SB equal to absolute value of self-discharge current of the SB. Thus, it is possible to control the constant voltage of the battery under test and measure the self-discharge thereof.

Figure 3:
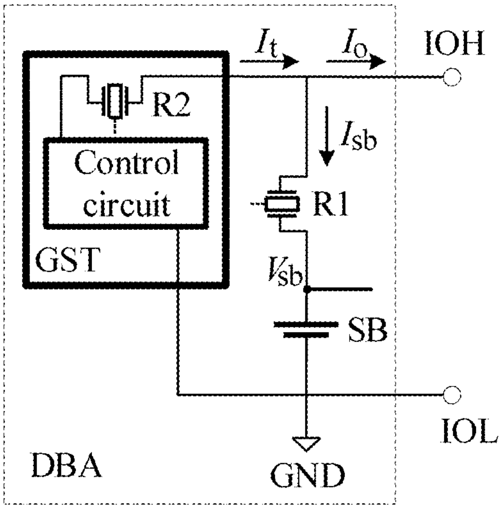
FIG. 3 is a block diagram of another example DBA, according to the present disclosure.

FIG. 3 is a block diagram showing another example DBA, according to the present disclosure. As shown in FIG. 3, the DBA may further comprise a first current sensor (denoted as R1) outside the GST. In some examples, the current sensor R1 is connected to the SB in series for measuring the current $I_{sd}$, whereby the controllable current ($I_t$) from the DBA may be controlled by feedback from the current sensor R1. In some examples, the DBA may further comprise a second current sensor (denoted as R2) inside the GST. In some examples, the current sensor R2 is for measuring the current It directly, whereby the current $I_t$ may be controlled by feedback from the current sensor R2. It is worth noting that the DBA may comprise only one of the current sensors R1 and R2 or both.

In some examples, when a battery is connected to the DBA via the terminals (IOH) and (IOL), the equation $I_r=I_O+I_{sb}$ will be satisfied, wherein $I_O$ represents the current flowing to the terminal (IOH). Accordingly, the current $I_O$ may be following to keep the potential of the terminal (IOH).

In some examples, a normal battery may include a secondary rechargeable battery, instead of a dedicated special primary (non-rechargeable) standard battery. In some examples, the normal battery may include a lithium ion battery. In some examples, a normal battery may have the same type as the battery under test. When using the same type of battery as the battery under test as the standard battery, the influence of temperature on the battery can be canceled or eliminated. A normal battery may comprise a secondary rechargeable battery.

Figure 4:
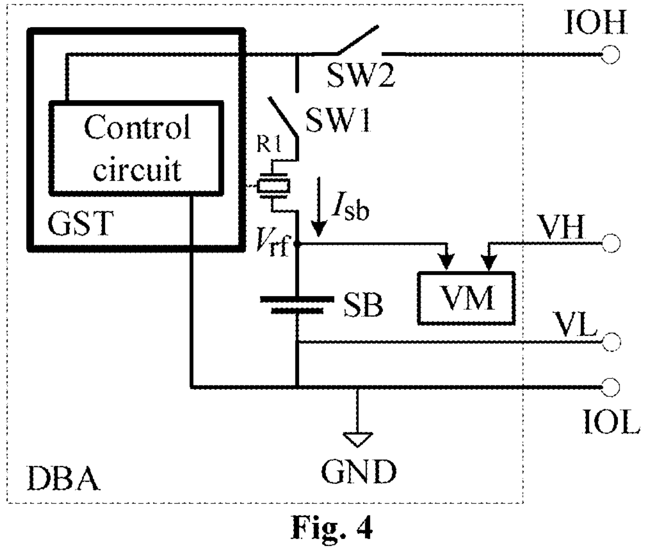
FIG. 4 is a block diagram of yet another example DBA, according to the present disclosure.

FIG. 4 is a block diagram of yet another example DBA, according to the present disclosure. As shown in FIG. 4, the DBA may further comprise another two terminals (VH) and (VL) and a circuit block for voltage measurement (VM). Alternatively, the DBA may further comprise a first switch (denoted as SW1) and a second switch (denoted as SW2) as shown in FIG. 4. The switch SW1 may connect to the current sensor R1 serially and the switch SW2 may be located to connect or disconnect the current $I_O$. When a battery being tested is connected to the DBA via the terminals (VH) and (VL) and both SW1 and SW2 (if they exist) are kept on, the VM will measure the difference between the voltage of the battery under test and the reference voltage (denoted as $V_{rf}$), which is determined on the basis of the voltage $V_{sb}$. Thus, the DBA described above can be used for high-precision battery voltage measurement/comparison through differential voltage measurement by means of applying a constant current to a normal battery to provide a constant voltage as a reference voltage. In some examples, the DBA may have multiple reference voltage ranges. A programmable reference voltage can be provided through various methods. In some examples, the voltage $V_{rf}$ can be selected as one of a plurality of normal batteries above with different OCVs.

Figure 5:
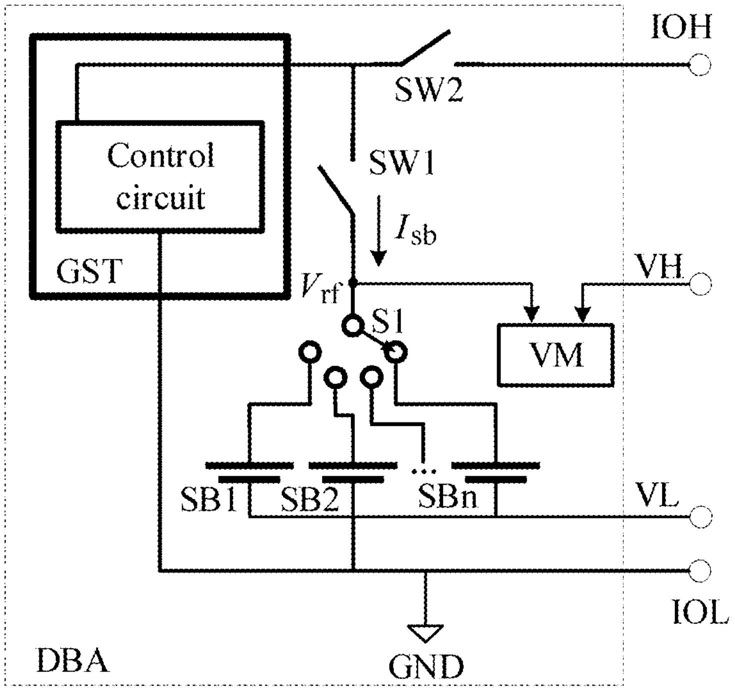
FIG. 5 is a block diagram of an example universal differential battery analyzer (UDBA), according to the present disclosure.

FIG. 5 is a block diagram showing an example universal differential battery analyzer (UDBA), according to the present disclosure. As shown in FIG. 5, the DBA, based on the description in FIG. 4 above, may further comprise another switch (denoted as S1) to select one from a plurality of normal batteries (such as SB1, SB2, SBn) with different OCVs. Thus, the voltage $V_{rf}$ provided by the DBA can be changed with the selected battery.

In some examples, for a normal battery at nearly balanced status, the change of the current therethrough will cause voltage change thereof within a very small voltage range, wherein such current through the normal battery is usually very small so as to not interrupt the electrochemical balance of the battery. In some examples, such current may be at the level of leakage current of the normal battery. Under these circumstances, the voltage of the normal battery can change slowly with the current therethrough. Accordingly, the voltage $V_{rf}$ will be changed when the voltage of the normal battery changes slowly. Although this method takes a long time to reach equilibrium to change the voltage $V_{rf}$, the obtained reference voltage range has the lowest electrical signal noise.

Figure 6:
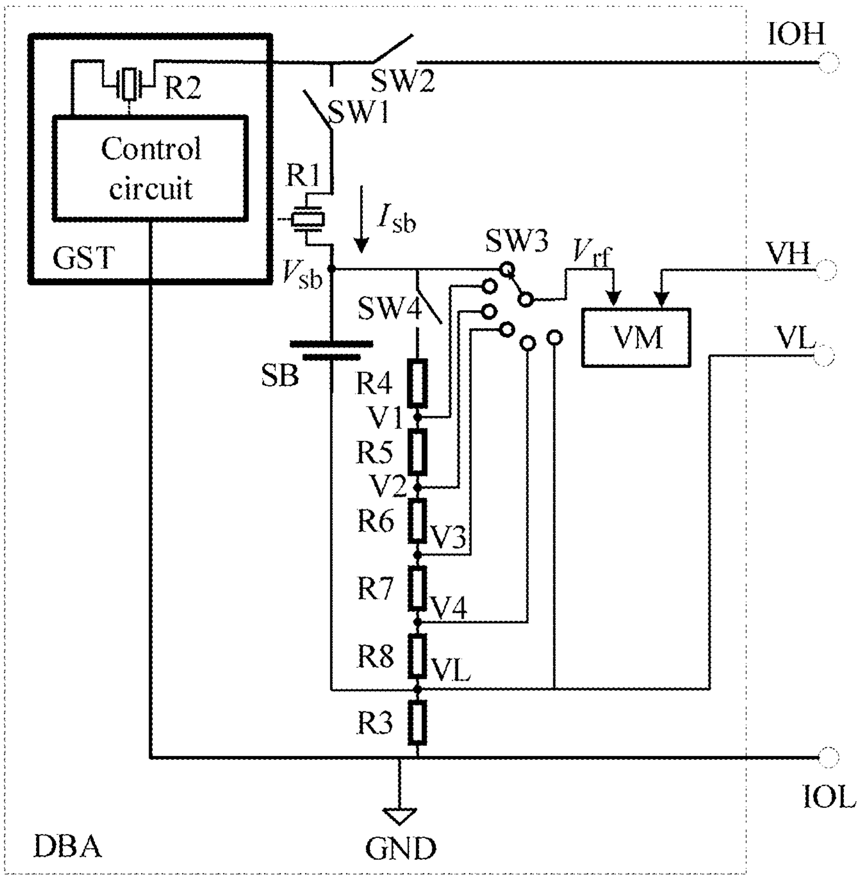
FIG. 6 is a block diagram of another example universal differential battery analyzer (UDBA), according to the present disclosure.

In some examples, the voltage $V_{rf}$ can be selected as one of a plurality of reference voltages within a range not greater than a value of the voltage $V_{sb}$. FIG. 6 is a block diagram showing another example universal differential battery analyzer (UDBA), which provides a programmable reference voltage by dividing the voltage of the standard battery, according to the present disclosure. As shown in FIG. 6, the UDBA may further comprise a plurality of resistors (such as R4, R5, R6, R7, R8) connected serially with each other and in parallel with the branch where the SB is located. Each resistor has its respective reference voltage output terminal (such as V1, V2, V3, V4, VL) used for being selected via a multiplexer (denoted as SW3) connected to the VM described above. Therefore, a UDBA with multiple voltage ranges is obtained. In one embodiment, a voltage range includes 4.2±0.2V ($V_{sb}$ range)/3.8±0.2V (corresponding to V1)/3.4±0.2V (corresponding to V2)/3.0±0.2V (corresponding to V3)/2.6±0.2V (corresponding to V4). In another embodiment, a voltage range includes 4.0±0.5V (corresponding to V1)/3.0±0.5V (corresponding to V2)/2.0±0.5V (corresponding to V3)/1.0±0.5V (corresponding to V4)/0.0±5.0V (VL range).

Alternatively, a switch (denoted as SW4) may be located in the branch where the divider resistors are connected serially with each other. SW4 can be turned off in $V_{sb}$ range or VL range, that is, the branch of divider resistors can be cut off to reduce the noise level. The role of a DBA/UDBA in VL range is the same as that of a general VM. It should be noted that $V_{sb}$ range has the lowest noise, and the noise when using voltage divider resistors is 2~3 times higher than that of $V_{sb}$ range.

Alternatively, a grounding resistor (denoted as R3) may be connected between the SB and the terminal (IOL) to cancel or eliminate voltage fluctuations of GND (Ground). Alternatively, one or more components of R1, R2, SW1 and SW2 may be eliminated.

There are advantages to using the UDBA described above. The reference voltage value can be quickly switched to obtain differential voltage measurements of different ranges, which is highly versatile and practical. Regular voltage ranging is for meeting the varied scales of voltage of the object under test, such as ±100V/±10V/±1/±0.1V/. Reference voltage range in this disclosure is different and unique, which is to meet a requirement for different section of a voltage scale such as 0~5V. This is especially unique to be applied to a reference voltage from a standard battery. Examples include 4.0±0.5V/3.0±0.5V/2.0±0.5V/1.0±0.5V/0.0±0.5V in voltage scale of 0~4.5V.

In some examples, the DBA, based on the DBA described above, may further comprise another two terminals (IH) and (VL) connected to a circuit block for current measurement (IM). In these circumstances, a DBA with current reading terminals is provided.

Figure 7:
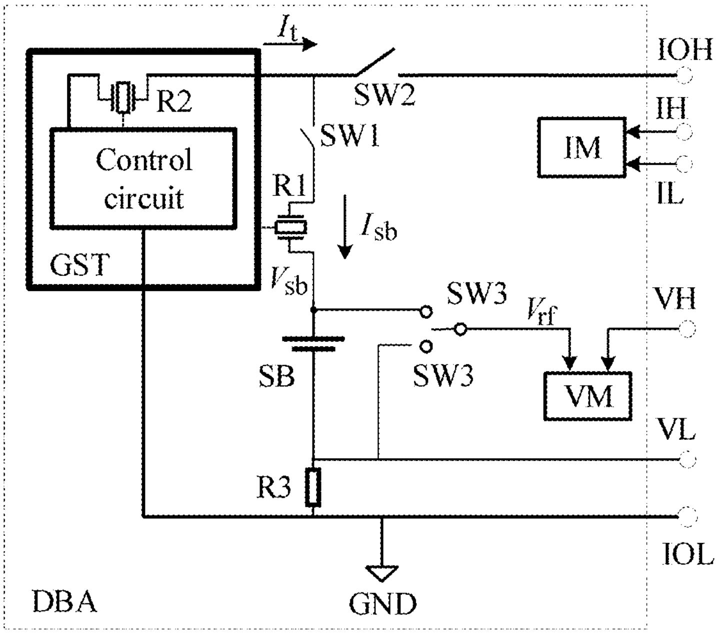
FIG. 7 is a block diagram of yet another example DBA, according to the present disclosure.

FIG. 7 is a block diagram of yet another example DBA, according to the present disclosure. In terms of components of the DBA shown in FIG. 7, reference can be made to the above.

FIG. 8 is an illustrative circuit for measuring differential voltage using the DBA, according to the present disclosure. As shown in FIG. 8, a battery under test may be connected to the DBA described above via the terminals (VH) and (VL). Detailed descriptions of components of the DBA shown in FIG. 8 are provided above. In this way, a differential voltage representing a difference between the voltage $V_{rf}$ and the voltage of the terminal (VH) can be measured by means of the VM inside the DBA. In some examples, such battery under test includes a group of batteries connected or not connected in parallel. Thus, this circuit can be used for differential voltage measurement for single or multiple batteries.

FIG. 9 is an illustrative circuit for measuring $I_{sb}$ by applying constant voltage equal to the OCV of a battery under test, which is called a potentiostatic method. This method is believed to be used in Keysight's Self-Discharge Analyzer.

FIG. 10 is an illustrative circuit for measuring $I_{sd}$ by applying constant current to a battery under test, according to the present disclosure. As shown in FIG. 10, a galvanostatic method is used to measure the self-discharge current of a battery. This disclosure illustrates a mechanism that uses the concept of dynamic capacitance to model a battery, preferably using this modeling during self-discharge current measurement. Using the above model, a galvanostat to provide controlled current output may give small currents $I_1$ and $I_2$ to a battery under test. By measuring $(dV/dt)_1$ at $I_1$ and $(dV/dt)_2$ at $I_2$ respectively, self-discharge current $I_{sd}$ and dynamic capacitance (DNC) of the battery under test can be calculated by solving the two equations: $(dV/dt)_1*DNC=I_1+I_{sd}$, and $(dV/dt)_2*DNC=I_2+I_{sd}$.

Figure 11:
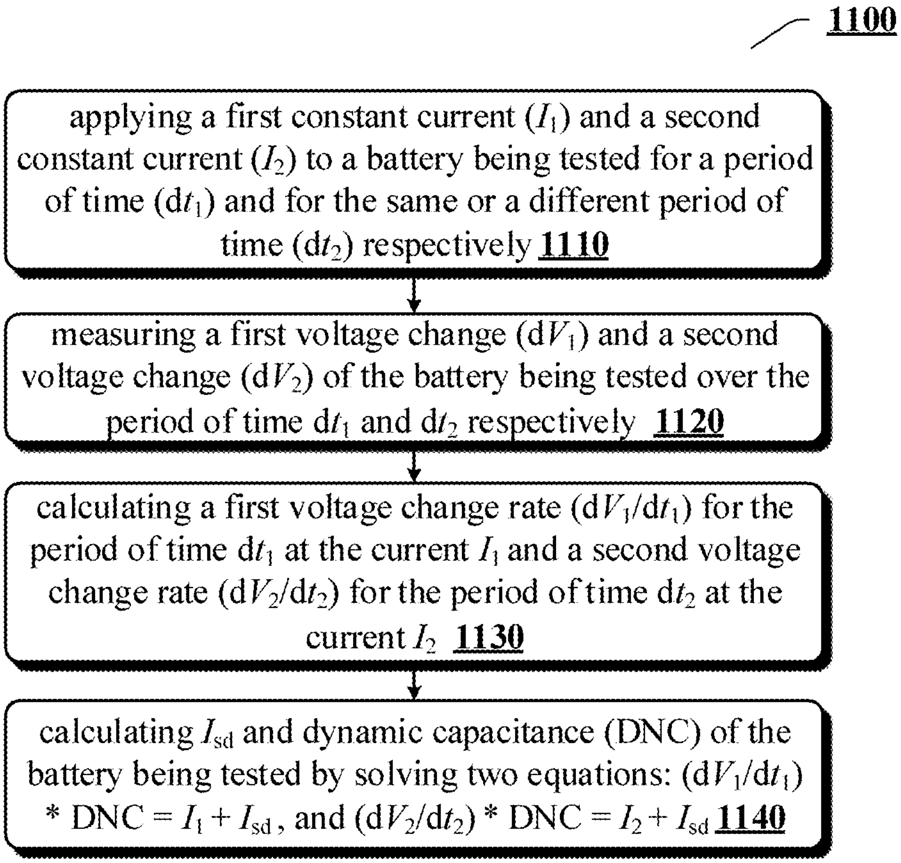
FIG. 11 is an illustrative block flow diagram for a process for measuring $I_{sd}$ by applying constant current to the battery, according to the present disclosure, which is called a galvanostatic method.

FIG. 11 depicts an example process 1100 for measuring $I_{sd}$ by applying constant current to a battery under test, in accordance with examples of the disclosure, which is called a galvanostatic method. For example, some or all of the process 1100 may be performed by one or more components in the DBA shown in FIGS. 2-8, as described herein.

At operation 1110, the process may include applying a first constant current ($I_1$) and a second constant current ($I_2$) to a battery being tested for a period of time ($dt_1$) and for the same or a different period of time ($dt_2$), respectively. The current $I_1$ and $I_2$ are low enough not to interrupt the electrochemical balance of the battery being tested, but preferably high enough to accelerate the test.

In some examples, each of currents $I_1$ and $I_2$ is less than 100 μA. In some examples, each of currents $I_1$ and $I_2$ is less than 50 μA. In some examples, each of currents $I_1$ and $I_2$ can be larger than 100 μA even in mA range depending on the dynamic capacity of the battery being tested. In some examples, such battery being tested includes a group of batteries connected in parallel.

At operation 1120, the process may include measuring a first voltage change ($dV_1$) and a second voltage change ($dV_2$) of the battery being tested over the period of time $dt_1$ and $dt_2$ respectively. In some examples, the two voltage changes may be measured by various means, such as the DBA with the VM described above. In some examples, each of the periods of time $dt_1$ and $dt_2$ is less than 24 hours.

At operation 1130, the process may include calculating a first voltage change rate ($dV_1/dt_1$) for the period of time $dt_1$ at the current $I_1$ and a second voltage change rate ($dV_2/dt_2$) for the period of time $dt_2$ at the current $I_2$.

At operation 1140, the process may include calculating $I_{sd}$ and dynamic capacitance (DNC) of the battery being tested by solving two equations: $(dV/dt_1)*DNC=I_1+I_{sd}$, and $(dV_2/dt_2)*DNC=I_2+I_{sd}$. It can be seen that using the current control (Galvanostatic) method described herein is different from the prior art voltage control (Potentiostatic) method to analyze self-discharge current of a battery. The galvanostatic method is useful especially in a battery formation procedure and in a battery testing procedure.

Figure 12:
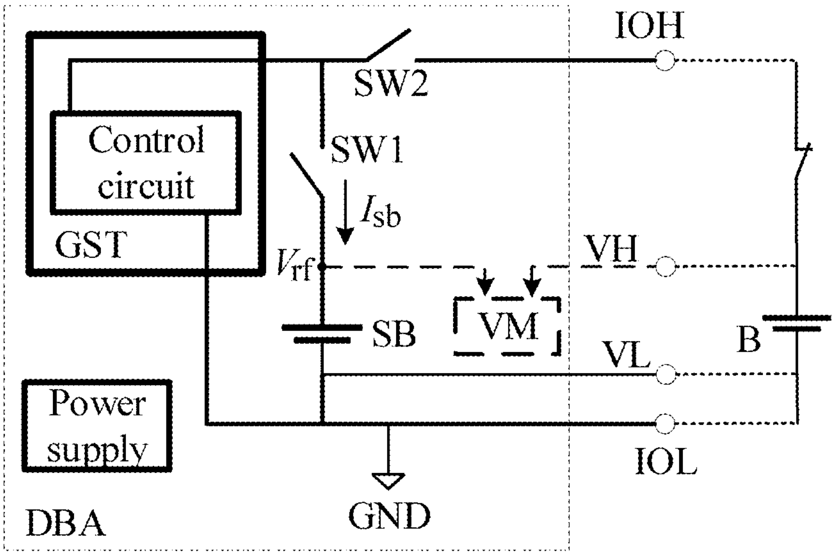
FIG. 12 is an illustrative circuit for measuring $I_{sd}$ by applying constant current to the battery with the DBA, according to the present disclosure.

FIG. 12 is an illustrative circuit for measuring $I_{sd}$ by applying constant current to the battery with a DBA, according to the present disclosure. As shown in FIG. 12, a battery being tested is connected to the above DBA via the terminals (IOH) and (IOL). The DBA may be used to provide a first constant current $I_1$ and a second constant current $I_2$. As discussed above, a first voltage change and a second voltage change of the battery being tested over the periods of time $dt_1$ and $dt_2$ may be measured respectively. Then, $I_{sd}$ and dynamic capacitance of the battery being tested can be calculated by solving the two equations above.

In some examples, the DBA may further comprise another two terminals (VH) and (VL) and a circuit block for voltage measurement (VM) for measuring differential voltage between a reference voltage ($V_{rf}$) and the voltage of the battery being tested, as described in FIG. 4. In such examples, the voltage $V_{rf}$ is determined on the basis of the voltage $V_{sb}$. As shown in FIG. 12, the battery being tested may be further connected to the DBA via the terminals (VH) and (VL), whereby the two voltage changes can be measured by means of the VM.

Figure 13:
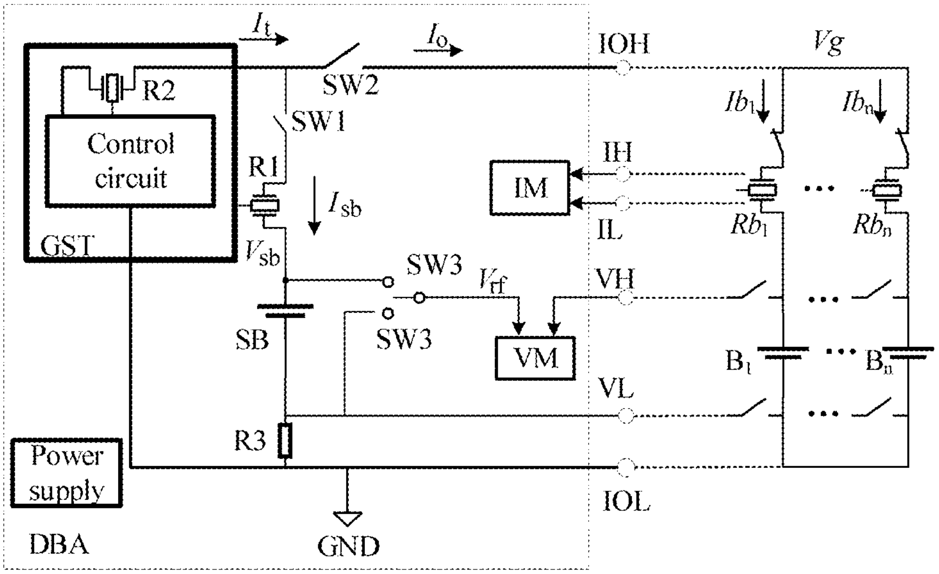
FIG. 13 is an illustrative circuit for measuring $I_{sd}$ of a group of batteries connected in parallel by applying constant current to the batteries with the DBA, according to the present disclosure.

FIG. 13 is an illustrative circuit for measuring $I_{sd}$ of a group of batteries connected in parallel by applying constant current to the batteries with the DBA, according to the present disclosure. As shown in FIG. 13, a group of batteries connected in parallel can be connected to the DBA via the terminals (IOH) and (IOL). Besides, the group of batteries are further connected to the IM inside the DBA via terminals (IH) and (IL). In such examples, each of the IM and the VM has a plurality of channels for measuring multiple batteries simultaneously. That is, the current through each battery of the group of batteries and the voltage change due to the current can be measured by means of the IM and the VM, respectively.

With reference to FIG. 13, a galvanostatic method for measuring self-discharge current ($I_{sd}$) of batteries connected in parallel is provided as follows. For example, small currents $I_1$ and $I_2$ from the GST can be applied to the batteries when SW2 is on. For one battery of the batteries connected in parallel, the current therethrough and the voltage change thereof can be measured by means of the IM and the VM, respectively. Then, $I_{sd}$ and dynamic capacitance (DNC) of the battery can be calculated by solving the two equations provided above. Thus, a galvanostatic method to obtain $I_{sd}$ and DNC of every battery in the group, as well as the SB, is provided.

Figure 14:
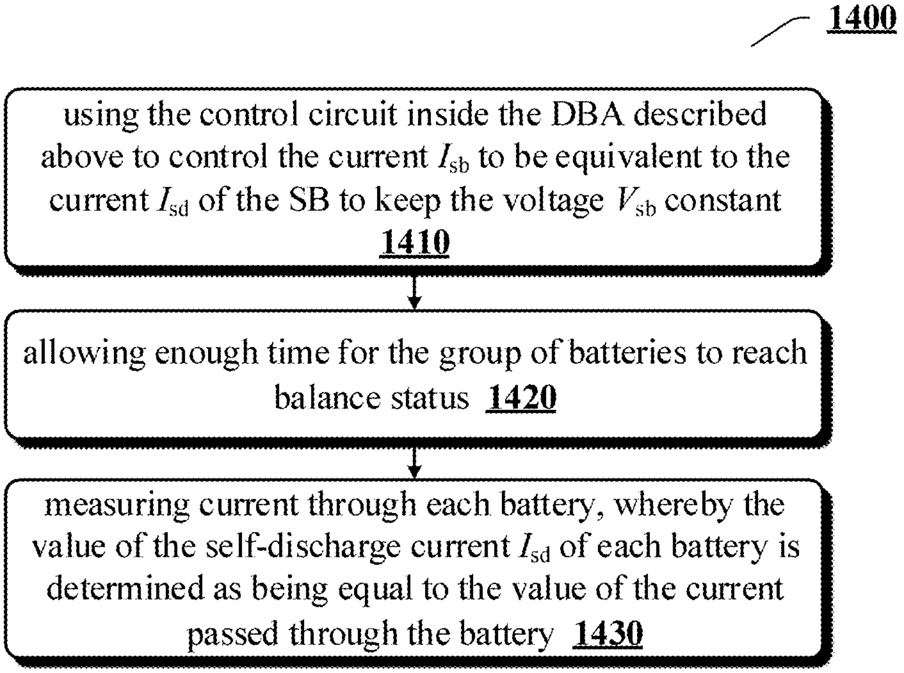
FIG. 14 is another illustrative block flow diagram for a process for measuring $I_{sd}$ by applying constant current to the battery, according to the present disclosure.

FIG. 14 depicts another example process 1400 for measuring $I_{sd}$ by applying constant current to the battery, in accordance with examples of the disclosure. For example, some or all of the process 1400 may be performed by one or more components in the DBA shown in FIGS. 2-8, as described herein.

At operation 1410, the process may include using the control circuit inside the DBA described above to control the current $I_{sb}$ to be equivalent to the current $I_{sd}$ of the SB to keep the voltage $V_{sb}$ constant, wherein a group of batteries are connected in parallel to the DBA via the terminals (IOH) and (IOL). In some examples, the means includes the GST. Alternatively, the GST may control the current $I_{sb}$ using the feedback from the sensor R1. In such examples, the current $I_{sd}$ of the battery SB is predetermined. Alternatively, the current $I_{sd}$ of the battery SB can be determined using the galvanostatic method described above with reference to FIG. 11.

At operation 1420, the process may include allowing enough time for the group of batteries to reach a balanced status. In such examples, voltage of each battery under test will reach and remain constant at its OCV under that balanced status.

At operation 1430, the process may include measuring current through each battery, whereby the value of the self-discharge current $I_{sd}$ of each battery is determined as being equal to the value of the current passed through the battery. In some examples, current through one battery (denoted as battery #) of the batteries (denoted as $I_b$ #) will reach the self-discharge current of the battery # (denoted as $I_{sd\ \#}$) when the batteries reach their balanced status. Thus, there is no need to measure voltage and dV/dt of each battery.

Figure 15:
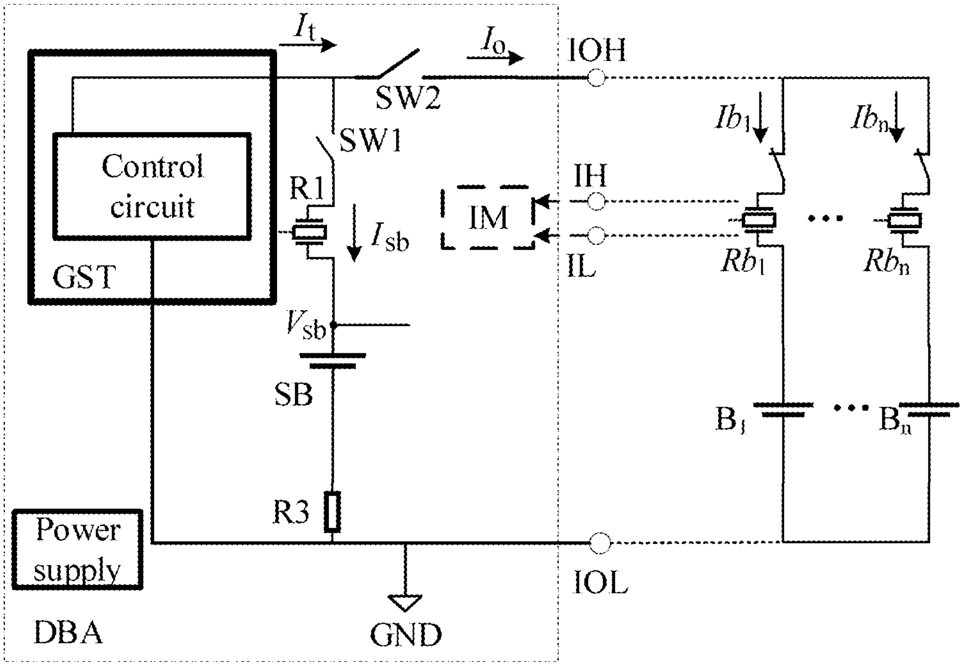
FIG. 15 is another illustrative circuit for measuring $I_{sd}$ by applying constant current to the battery with the DBA, according to the present disclosure.

FIG. 15 is another illustrative circuit for measuring $I_{sd}$ by applying constant current to the battery with the DBA, according to the present disclosure. As shown in FIG. 15, a group of batteries in parallel can be connected to the DBA described above via the terminals (IOH) and (IOL).

In some examples, the DBA may further comprise an IM as discussed above. In such examples, the IM can measure current through each battery by means of a plurality of channels. It can be understood that the value of the current $I_{sd}$ of each battery is determined as equal to the value of the current through its corresponding battery with reference to the method illustrated in FIG. 14 with both SW1 and SW2 on.

Figure 16:
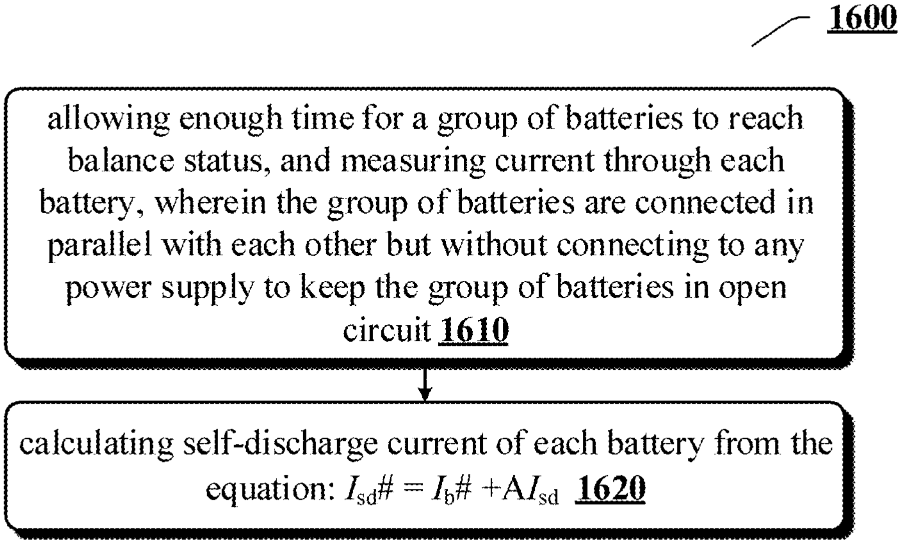
FIG. 16 is an illustrative block flow diagram for a process for measuring $I_{sd}$ without applying any current to the battery, according to the present disclosure, which is called a passive method.

FIG. 16 depicts another example process 1600 for measuring $I_{sd}$ of batteries in a group that are connected in parallel, in accordance with examples of the disclosure, which is called a passive method. For example, FIG. 15 provides an illustrative circuit for carrying out the passive method, where the batteries can be in open circuit when SW2 is left off.

At operation 1610, the process may include allowing enough time for a group of batteries to reach a balanced status, and measuring current through each battery, wherein the group of batteries are connected in parallel with each other, but without connecting to any power supply to keep the group of batteries in open circuit. In some examples, current through one battery of the batteries (battery #) can be denoted as $I_b$ #. In some examples, balanced status may be considered to have been reached when the current through the battery or voltage change rate of the battery no longer varies or varies within a predetermined small range.

At operation 1620, the process may include calculating self-discharge current of each battery (denoted as $I_{sd}$ #) from the equation: $I_{sd}$ #=$AI_{sd}$−$I_b$#. $AI_{sd}$ represents average self-discharge current of all batteries in the group. $I_b$ #represents the current through the corresponding battery #. Assuming the difference of dynamic capacitance (DNC) of all batteries in the group can be ignored in calculation of self-discharge current and $AI_{sd}$ is known, self-discharge current of each battery can be calculated from the above equation. Thus, there is no need to measure voltage and dV/dt of each battery, assuming the DNC of batteries is known and the difference of DNC between batteries can be ignored. This method is especially useful in a finishing procedure in battery manufacturing.

In some examples, such $AI_{sd}$ is determined as a ratio of total self-discharge current ($TI_{sd}$) of the group of batteries to the number of the batteries in the group being tested. In such examples, the group of batteries can be regarded as an equivalent battery in calculation of total self-discharge current. For example, FIG. 13 provides an illustrative circuit for calculating the total self-discharge current. In such example, both SW1 and SW2 are left on. In some examples, the total self-discharge current can be determined with reference to the galvanostatic method described above. To be specific, the galvanostatic method can comprise the steps of: applying a first constant current ($I_1$) and a second constant current ($I_2$) to the group of batteries connected in parallel for a period of time ($dt_1$) and for the same or a different period of time ($dt_2$) respectively, wherein the currents $I_1$ and $I_2$ are low enough not to interrupt the electrochemical balance of the group of batteries being tested; measuring a first voltage change ($dV_1$) and a second voltage change ($dV_2$) of the group of batteries being tested over the periods of time $dt_1$ and $dt_2$, respectively; calculating a first voltage change rate ($dV_1/dt_1$) for the period of time $dt_1$ at the current $I_1$ and a second voltage change rate ($dV_2/dt_2$) for the period of time $dt_2$ at the current $I_2$; calculating total self-discharge current ($TI_{sd}$) and total dynamic capacitance (TDNC) of the group of batteries being tested by solving two equations: $(dV_1/dt_1)^*TDNC=I_1+TI_{sd}$, and $(dV_2/dt_2)^*TDNC=I_2+TI_{sd}$. Thus, a galvanostatic method to obtain $AI_{sd}$ of the battery group is provided.

Figure 17:
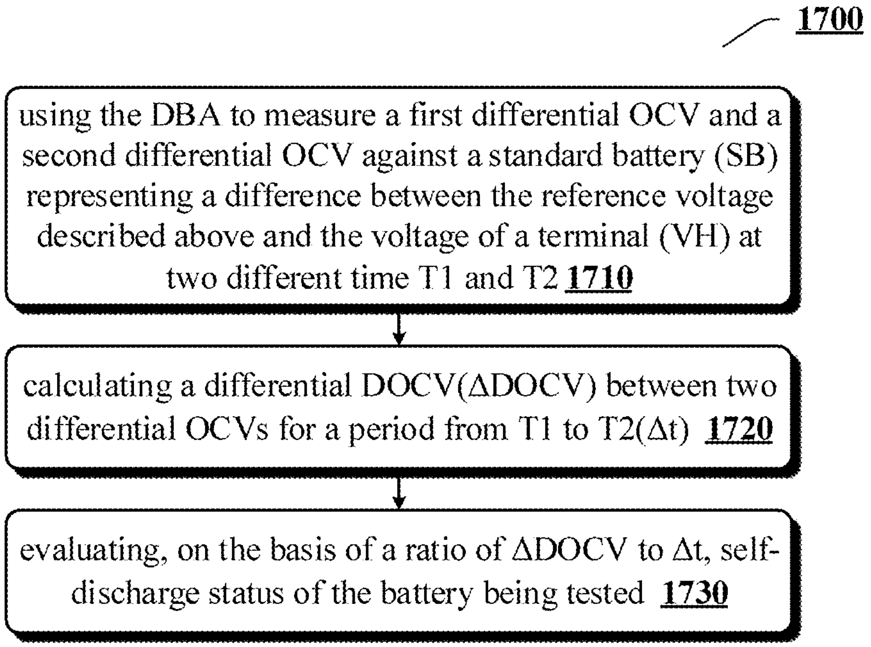
FIG. 17 is an illustrative block flow diagram for a process for evaluating self-discharge of a battery by means of the DBA, according to the present disclosure.

FIG. 17 depicts an example process 1700 for evaluating self-discharge of a battery by means of a DBA with a VM, in accordance with examples of the disclosure. For example, some or all of the process 1700 may be performed by one or more components in the DBA shown in FIGS. 4-8, as described herein.

At operation 1710, the process may include using the DBA described above to measure a first differential OCV (denoted as DOCV1) and a second differential OCV (denoted as DOCV2) against the standard battery (SB) representing a difference between the reference voltage described above and the voltage of a terminal (VH) at two different times T1 and T2, wherein a battery being tested is connected to the DBA with a VM described above via terminals (VH) and (VL). In some examples, the DBA further comprises a first current sensor connected to the SB in series for measuring the current through the SB and providing feedback to control an output current from the control circuit. In such examples, the current through the SB is controlled to be equal to self-discharge current of the SB, whereby the voltage of the SB is kept constant at its open-circuit voltage (OCV). For example, an illustrative circuit for carrying out the method can be referred to FIG. 8 with SW1 on. In some examples, DOCV1=V1−$V_{rf}$ and DOCV2=V2−$V_{rf}$ are satisfied, where V1 and V2 represent the voltage of the terminal at times T1 and T2, respectively. In some examples, each of T1 and T2 is less than 24 hours.

At operation 1720, the process may include calculating a differential DOCV (ΔDOCV) between two differential OCVs for a period from T1 to T2 (Δt). In such examples, ΔDOCV=DOCV2−DOCV1 and Δt=T2−T1.

qwAt operation 1730, the process may include evaluating, on the basis of a ratio of ΔDOCV to Δt, self-discharge status of the battery being tested. In some examples, a K value representing the ratio of ΔDOCV to Δt of a battery can be calculated to evaluate self-discharge status of the battery under test. This method for measuring differential OCV can be particularly useful in making batteries In some examples, a battery being tested includes a group of batteries. Each of the group of batteries can connect or disconnect to the VM via a switch. In such examples, the process may further include sorting the group of batteries according to the self-discharge status. In such examples, the group of batteries can be sorted according to their values of self-discharge parameters. These parameters may include, but not be limited to, at least one of the following: OCV, SD representing a differential DOCV (ΔDOCV) between two differential OCVs for a period of time, and the K value mentioned above. In some examples, these parameters may further include, but not be limited to, at least one of $I_{sd}$ and SDR. In this way, batteries having reasonably consistent values for the parameters can be sorted into one group. Compared with other methods for grading and sorting batteries that include modeling, algorithms and electrochemical analysis, this method provided in the present disclosure is much easier, thereby saving or reducing storage time and improving the battery manufacturing process.

In some examples, the process may further include calculating self-discharge current ($I_{sd}$) of one or more batteries in the group on the basis of known dynamic capacitance (DNC) value of one or more batteries in the group or average DNC value of the group of batteries. In such examples, self-discharge current of each battery is calculated from the equation: $I_{sd}$ #=ΔQ/Δt=DNC (or ADNC)*ΔDOCV/Δt, wherein $I_{sd}$#represents the self-discharge current of the target battery #. ADNC represents average DNC value of all batteries in the group.

In some examples, ADNC can be calculated from obtained historical DNCs. In some examples, ADNC value of the group of batteries can be determined as a ratio of total DNC (TDNC) of all batteries in the group to the number of the batteries in the group being tested. Alternatively, the TDNC can be determined with reference to the galvanostatic method described above regarding the group of batteries as an equivalent battery by solving two equations: $(dV_1/dt_1)$ *TDNC=$I_1$+$TI_{sd}$, and $(dV_2/dt_2)$*TDNC=$I_2$+$TI_{sd}$.

Figure 18:
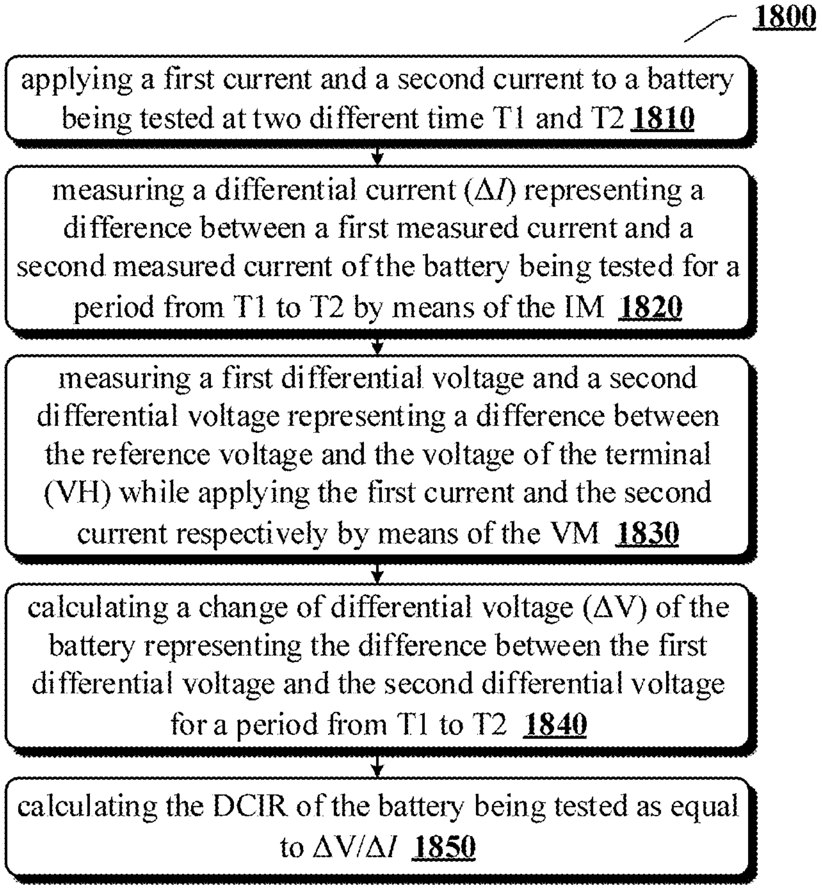
FIG. 18 is an illustrative block flow diagram for a process for measuring direct current internal resistance of a battery by means of the DBA, according to the present disclosure.

FIG. 18 depicts an example process 1800 for measuring direct current internal resistance of a battery by means of a DBA, in accordance with examples of the disclosure. For example, FIG. 13 provides an illustrative circuit for carrying out this method with both SW1 and SW2 on.

At operation 1810, the process may include applying a first current and a second current to a battery being tested at two different times T1 and T2, wherein a battery being tested is connected to the DBA described above via terminals (VH) and (VL). The DBA further comprises two terminals (IH) and (IL) connected to a circuit block for current measurement (IM), wherein a sensor is connected between terminals (IH) and (IL) and connected with the battery in series for measuring the current through the battery. In some examples, the first current and the second current are low enough not to interrupt the electrochemical system of the battery. In some examples, the IM may have a plurality of channels for measuring current through each battery in a group connected thereto.

At operation 1820, the process may include measuring a differential current (ΔI) representing a difference between a first measured current and a second measured current of the battery being tested for a period from T1 to T2 by means of the IM. In some examples, for one battery of a group of batteries (denoted as battery #), a differential current is determined by the equation: $\Delta I_b$#=$I_{b\ \#2}$−$I_{b\ \#1}$. $I_{b\ \#1}$ and $I_{b\ \#2}$ represent the first measured current and the second measured current through battery #using the IM, respectively.

At operation 1830, the process may include measuring a first differential voltage and a second differential voltage representing a difference between the reference voltage and the voltage of the terminal (VH) while applying the first current and the second current respectively by means of the VM. In some examples, for one battery of the batteries (denoted as battery #), a first differential voltage is determined by the equation: $V_{b\ \#1}$=$V_{\#1}$−$V_{rf}$. V $\#_1$ represents the voltage of the terminal (VH) of battery #while applying the first current. And a second differential voltage is determined by the equation: $V_{b\ \#2}$=V $\#_2$−$V_{rt}$. V $\#_2$ represents the voltage of the terminal (VH) of battery #while applying the second current.

At operation 1840, the process may include calculating a change of differential voltage (ΔV) of the battery representing the difference between the first differential voltage and the second differential voltage for a period from T1 to T2. In some examples, for one battery of the batteries (denoted as battery #), the change of differential voltage (ΔV) of the battery being tested for a period from T1 to T2 is determined by the equation: ΔV #=$V_{b\ \#2}$−$V_{b\ \#1}$.

At operation 1850, the process may include calculating the DCIR of the battery being tested as equal to ΔV/ΔI. In some examples, for one battery of the group of batteries (denoted as battery #), the DCIR of the battery being tested is determined by the equation: DCIR #=ΔV #/ΔI #. Similarly, the equivalent resistance of a group of batteries under test can be calculated with reference to the above method regarding the group of batteries as an equivalent battery. This method usually can be applied to battery testing, especially in battery formation.

An auto analyzer for evaluating batteries is provided in this disclosure. In some examples, an auto analyzer for evaluating batteries may comprise a power supply, one or more processors and one or more storage media storing instructions executable by the one or more processors, wherein the instructions, when executed, cause the auto analyzer to perform operations according to any one of following: a method for measuring differential voltage, a galvanostatic method for measuring self-discharge current of a battery, a galvanostatic method for measuring self-discharge current of a battery using a differential analyzer described above, a passive method for measuring self-discharge current of batteries in a group that are connected in parallel, a method for evaluating self-discharge of a battery and a method for measuring direct current internal resistance of a battery. Detailed descriptions of these methods have been discussed above with reference to FIG. 8 to FIG. 18.

In some examples, the processor(s) may be any suitable processor capable of executing instructions to process data and perform operations as described herein. By way of example and not limitation, the processor(s) may include one or more Central Processing Units (CPUs), Graphics Processing Units (GPUs), or any other device or portion of a device that processes electronic data to transform that electronic data into other electronic data that can be stored in registers and/or memory. In some examples, the processor(s) may include a circuit assembly, such as integrated circuits (e.g, ASICs, etc.), gate arrays (e.g, FPGAs, etc.), and other hardware devices in so far as they are configured to implement encoded instructions.

In some examples, the storage media may include non-transitory computer-readable media, such as a memory. In such examples, the memory may store an operating system and one or more software applications, instructions, programs, and/or data to implement the methods described herein and the functions attributed to the various systems. In various implementations, the memory can be implemented using any suitable memory technology, such as static random access memory (SRAM), synchronous dynamic RAM (SDRAM), nonvolatile/Flash-type memory, or any other type of memory capable of storing information.

In some instances, the memory may include at least a working memory and a storage memory. For example, the working memory may be a high-speed memory of limited capacity (e.g, cache memory) that is used for storing data to be operated on by the processor(s). In some instances, the memory may include a storage memory that may be a lower-speed memory of relatively large capacity that is used for long-term storage of data. In some cases, the processor(s) may not operate directly on data that is stored in the storage memory, and data may need to be loaded into a working memory for performing operations based on the data, as discussed herein.

In some examples, the auto analyzer may be integrated into a DBA described above. In such cases, the DBA with the auto analyzer is capable of testing various parameters of a battery automatically.

It can be understood that the architectures, systems, and individual elements described herein can include many other logical, programmatic, and physical components, of which those shown in the accompanying figures are merely examples that are related to the discussion herein.

Further Embodiments of the Invention

For a battery at a fully balanced status, a very small current at the level of leakage current of the battery will cause a linear voltage change against time within very small voltage range such as 10's of microvolts to a few millivolts. In this invention, a battery at its fully balanced status is considered as behaving like a supercapacitor within a small voltage range at a very small current. Supercapacitor behavior follows (dV/dt)*C=I+LC, where LC is leakage current and C is capacitance and I is the current applied to the capacitor. For a supercapacitor, C is a constant value and does not change with SOC (State of Charge), while leakage current LC will change along with SOC of supercapacitor. When voltage change rate dV/dt is measured with constant current I, LC can be calculated with known C value as LC=(dV/dt)*C−I. Using a supercapacitor to model a battery, a battery will have dynamic LC and dynamic C at certain SOC and follow (dV/dt)*C=I+LC, where both LC and C will change with different SOC. If two different currents I1 and I2 are applied at a same SOC and one measures (dV/dt)1 and (dV/dt)2 correspondingly, assuming both LC and C are same for the two currents, one can get LC and C values of the battery by solving two equations (dV/dt)1*C=I1+LC and (dV/dt)2*C=I2+LC. When the battery is fully balanced and this SOC and current I1 and I2 would not interrupt significantly the electrochemical balance of the battery, the dynamic LC calculated accordingly can be considered as leakage current at this SOC. When I1 and I2 is multiple times larger than LC, dV/dt is larger and needs less time to measure and/or needs less voltage precision from a voltmeter. Only a few hours is enough to measure LC of a battery at 95%~100% SOC.

Because current control is much easier than voltage control in very low current level and because a battery is very sensitive to even very small voltage noise/ripple, this method requires much simpler and low cost testing systems and needs much shorter time to get reliable results as compared to methods using voltage control. A regular battery testing system and battery formation system with high enough measurement accuracy/precision can be used for this method, instead of using special equipment, which could be very expensive and not precise enough.

If dynamic capacitance (DNC) of battery is known within a certain accuracy, dynamic LC(DNLC) can be calculated directly from (dV/dt)*C=I+LC, where dV/dt, C and I are known or measured.

When a number (N) of batteries with very similar characters are connected in parallel we can assume that the parallel group of batteries has a certain average dynamic capacitance ADNC=sum(DNC (1):DNC(N))/N and certain average dynamic leakage current ADNLC=sum(DNLC(1): DNLC (N))/N. When the paralleled battery group reaches an electrochemical balanced status, one should have DNLC(n) =ADNLC−I(n)+Ig/N, where I(n) is the current flow into the battery n and Ig is the total current flow into the parallel battery group. If we can assume that batteries with same chemical and mechanical structure and same specifications have fairly constant ADNC and ADNLC, which may be true in a massive battery testing and formation process, where battery cells are connected in parallel, one can directly measure each battery's leakage current by measuring current flow into each battery while the battery group is under balanced status and there is zero or very small external current flow Ig through the parallel group by DNLC(n) =ADNLC−I(n)+Ig/N. This process involves only current measurement under open circuit or very small current to the battery group and can be done instantly when the battery group reaches balancing status without need of a long time for voltage control/change and measurement. This invention will significantly lower the time and equipment needed for battery manufacturing.

Even if one does not have an exact value of ADNLC and DNLC(n), one still can compare DNLC of each battery in the parallel group by the value of I(n) once the parallel battery group is in balanced status. The effect of comparing I(n), or ALC(n)=LC(n)−ALC, instantly would be similar to comparing voltage drop AV(n) over a long period of time.

Additional embodiments of the invention include the following: a mechanism that uses a dynamic supercapacitor with dynamic capacitance and dynamic leakage current to model a battery during leakage current measurement; using the above model, applying two different currents, which are low enough not to interrupt the electrochemical balance of the battery but high enough to accelerate the test, to get two equation (dV/dt)1*C=I1+LC and (dV/dt)2*C=I2+LC. LC and C value of the battery can be solved from these 2 equations; using current control instead voltage control to batteries for leakage current measurement; connect a number of batteries in parallel without applying any current to the group (open circuit), measure current through each battery to get the difference of leakage current from average leakage current ALC(n)=LC(n)−ALC. LC(n)=ALC(n)−Ib (n); by solving the two equation (dVg/dt) 1*ADNC=ADNLC and (dVg/dt)2*ADNC=Ig+ADNLC to get ADNC and ADNLC, assuming ADNC=sum(LC1: LCn)/n and ADNC=sum(C1:Cn)/n; by applying Ig=−N* ALC to the parallel battery group and check if dVg/dt is close to 0 (in μV level), to check if ALC is the right value, and one can calculate the actual ALC; and using only one current source to or even without a current source to measure multiple cells' leakage current simultaneously.

Embodiments of the present invention include the following.

1. A battery testing apparatus comprising:

a normal battery operating as a standard battery (SB);

a constant current source configured to apply a controllable current through the normal battery ($I_{sb}$) that is equal to its self-discharge current, whereby a voltage of the normal battery is held constant at its open-circuit voltage (OCV); and a positive terminal (IOH) and a negative terminal (IOL) configured to connect a battery under test therebetween, wherein the voltage between the terminal (IOH) and the terminal (IOL) is kept at a constant value approximately equal to the voltage of the SB within a desired precision.

2. The battery testing apparatus of embodiment 1, further comprising a first current sensor configured to measure the current through the SB and to provide feedback to control an output current (It) from the constant current source.

3. The battery testing apparatus of embodiment 1, wherein the normal battery includes a secondary rechargeable battery.

4. The battery testing apparatus of embodiment 1, wherein the normal battery has the same type as the battery under test.

5. The battery testing apparatus of embodiment 1, further comprising:

another two terminals (VH) and (VL) configured to connect a battery under test therebetween, wherein the terminal (VL) is connected to the negative terminal of the SB;

a circuit block for voltage measurement (VM) configured to measure differential voltage between a reference voltage and the voltage of the battery under test, wherein the VM has a first lead connected to the terminal (VH) and a second lead connected to the positive terminal of the SB, wherein the reference voltage is determined on the basis of the voltage of the SB.

6. The battery testing apparatus of embodiment 1, further comprising:

another two terminals (VH) and (VL) configured to connect a battery under test therebetween, wherein the terminal (VL) is connected to the negative terminal of the SB;

a plurality of resistors configured to divide the voltage of the SB into a plurality of reference voltages within a range not greater than a value of the voltage of the SB;

a circuit block for voltage measurement (VM) having a first lead connected to the terminal (VH) and a second lead connected to a multiplexer configured to select one from the reference voltages, whereby the VM is configured to measure differential voltage between a programmable reference voltage and the voltage of the battery under test.

7. A battery analyzer for testing a battery comprising:

a normal battery operating as a standard battery (SB);

a control circuit configured to apply a controllable current through the normal battery ($I_{sb}$) that is equal to its self-discharge current, whereby a voltage of the normal battery is held constant at its open-circuit voltage (OCV);

a first current sensor configured to measure the current through the SB and to provide feedback to control an output current ($I_t$) from the galvanostat;

a positive terminal (IOH) and a negative terminal (IOL) configured to connect a battery under test therebetween, wherein the voltage between the terminal (IOH) and the terminal (IOL) is kept at a constant value approximately equal to the voltage of the SB within a desired precision; and a first switch configured to connect or disconnect the current $I_{sb}$ and a second switch configured to connect or disconnect the current flowing to the positive terminal.

8. A battery analyzer for testing a battery comprising:

a secondary rechargeable battery operating as a standard battery (SB);

a galvanostat configured to apply a controllable current through the normal battery ($I_{sb}$) that is equal to its self-discharge current, whereby a voltage of the normal battery is held constant at its open-circuit voltage (OCV);

a first current sensor configured to measure the current through the SB and to provide feedback to control an output current ($I_t$) from the galvanostat, wherein a second current sensor is configured to measure the current $I_t$;

a positive terminal (IOH) and a negative terminal (IOL) configured to connect a battery under test therebetween, wherein the voltage between the terminal (IOH) and the terminal (IOL) is kept at a constant value approximately equal to the voltage of the SB within a desired precision; and a first switch configured to connect or disconnect the current $I_{sb}$ and a second switch configured to connect or disconnect the current flowing to the positive terminal.

9. A differential battery analyzer (DBA) for testing a battery comprising:

a secondary rechargeable battery operating as a standard battery (SB);

a galvanostat configured to apply a controllable current through the normal battery ($I_{sb}$) that is equal to its self-discharge current, whereby a voltage of the normal battery is held constant at its open-circuit voltage (OCV);

a first current sensor configured to measure the current through the SB and to provide feedback to control an output current ($I_t$) from the galvanostat, wherein a second current sensor is configured to measure the current It;

a positive terminal (IOH) and a negative terminal (IOL) configured to connect a battery under test therebetween, wherein the voltage between the terminal (IOH) and the terminal (IOL) is kept at a constant value approximately equal to the voltage of the SB within a desired precision;

a first switch configured to connect or disconnect the current $I_{sb}$ and a second switch configured to connect or disconnect the current flowing to the positive terminal;

another two terminals (VH) and (VL) configured to connect a battery under test therebetween, wherein the terminal (VL) is connected to the negative terminal of the SB; and a circuit block for voltage measurement (VM) configured to measure differential voltage between a reference voltage and the voltage of the battery under test, wherein the VM has a first lead connected to the terminal (VH) and a second lead connected to the positive or negative terminal of the SB via a third switch, whereby the reference voltage is determined as the voltage of the SB or zero.

10. A differential battery analyzer (DBA) for testing a battery comprising:

a secondary rechargeable battery operating as a standard battery (SB);

a galvanostat configured to apply a controllable current through the normal battery ($I_{sb}$) that is equal to its self-discharge current, whereby a voltage of the normal battery is held constant at its open-circuit voltage (OCV);

a first current sensor configured to measure the current through the SB and to provide feedback to control an output current ($I_t$) from the galvanostat, wherein a second current sensor is configured to measure the current $I_t$;

a positive terminal (IOH) and a negative terminal (IOL) configured to connect a battery under test therebetween, wherein the voltage between the terminal (IOH) and the terminal (IOL) is kept at a constant value approximately equal to the voltage of the SB within a desired precision;

a first switch configured to connect or disconnect the current $I_{sb}$ and a second switch configured to connect or disconnect the current flowing to the positive terminal;

another two terminals (VH) and (VL) configured to connect a battery under test therebetween, wherein the terminal (VL) is connected to the negative terminal of the SB;

a circuit block for voltage measurement (VM) configured to measure differential voltage between a reference voltage and the voltage of the battery under test, wherein the VM has a first lead connected to the terminal (VH) and a second lead connected to the positive or negative terminal of the SB via a third switch, whereby the reference voltage is determined as the voltage of the SB or zero;

a circuit block for current measurement (IM) configured to measure current of the battery under test via another two terminals (IH) and (IL); and a power supply.

The embodiments described herein are merely examples for the sake of clarity and are not intended to limit the scope of the present invention. Other variations or modifications may be made by those skilled in the field of the above-described technology. There is no need and no way to describe all possible implementations of the principles of the difference measurement technology described herein. Obvious changes or variations resulting therefrom are still within the scope of the invention.

What is claimed is:

1. A differential battery analyzer (DBA) for testing a battery comprising:

a control circuit configured to apply a controllable current to a normal battery as a standard battery (SB) inside the DBA, wherein the current through the SB ($I_{sb}$) is controlled to be equal to its self-discharge current, whereby a voltage of the SB is kept constant at its open-circuit voltage (OCV); and two terminals (IOH) and (IOL) for connecting a battery under test therebetween, wherein the terminal (IOH) is connected to an end of a branch where the SB is located, and the voltage between the terminal (IOH) and the terminal (IOL) is kept at a constant value approximately equal to the voltage of the SB within a desired precision, and the terminal (IOL) is connected to the other end of the branch; and a first current sensor connected to the SB in series for measuring the current through the SB and providing feedback to control an output current (It) from the control circuit.

2. The DBA of claim 1, further comprising a second current sensor for measuring an output current from the control circuit and providing feedback to control the output current.

3. The DBA of claim 1, wherein the current flowing to the terminal (IOH) ($I_O$) is following to maintain the potential of the terminal (IOH) when a battery is connected to the DBA via the terminals (IOH) and (IOL), wherein $I_t=I_O+I_{sb}$.

4. The DBA of claim 3, wherein the control circuit includes a galvanostat, the DBA further comprising a second current sensor, two terminals (VH) and (VL), another two terminals (IH) and (IL) connected to a circuit block for current measurement (IM), a circuit block for voltage measurement (VM), a first switch connected to the first sensor serially, a second switch located to connect or disconnect the current flowing to the terminal (IOH), a grounding resistor connected between the SB and the terminal (IOL), and a plurality of resistors connected serially with each other and in parallel with the branch where the SB is located, wherein each resistor has its respective reference voltage output terminal which is selected via a multiplexer connected to the VM, whereby the voltage of the SB is divided into a plurality of reference voltages, wherein the second sensor is configured to measure an output current from the galvanostat and providing feedback to control it, wherein the VM is configured to measure differential voltage between a reference voltage and the voltage of the battery under test which is connected to the DBA via the terminals (VH) and (VL), and wherein the reference voltage is determined on the basis of the voltage of the SB.

5. The DBA of claim 1, further comprising the normal battery operating as the standard battery, wherein the normal battery includes a secondary rechargeable battery.

6. The DBA of claim 1, wherein the normal battery has the same type as the battery under test.

7. The DBA of claim 1, further comprising another two terminals (VH) and (VL) and a circuit block for voltage measurement (VM) for measuring differential voltage between a reference voltage and the voltage of the battery under test which is connected to the DBA via the terminals (VH) and (VL), wherein the reference voltage is determined on the basis of the voltage of the SB.

8. The DBA of claim 7, wherein the terminal (VL) is connected to the negative terminal of the SB, and the VM has a first lead connected to the terminal (VH) and a second lead connected to the positive terminal of the SB.

9. The DBA of claim 7, further comprising a first switch configured to connect or disconnect the current $I_{sb}$ and a second switch configured to connect or disconnect the current flowing to the positive terminal, and wherein the terminal (VL) is connected to the negative terminal of the SB, and the VM has a first lead connected to the terminal (VH) and a second lead connected to the positive or negative terminal of the SB via a third switch, whereby the reference voltage is determined as the voltage of the SB or zero.

10. The DBA of claim 7, wherein the reference voltage is selected as one of a plurality of reference voltages within a range not greater than a value of the voltage of the SB.

11. The DBA of claim 10, further comprising a plurality of resistors connected serially with each other and in parallel with the branch where the SB is located, wherein each resistor has its respective reference voltage output terminal which is selected via a multiplexer connected to the VM, whereby the voltage of the SB is divided into a plurality of reference voltages.

12. The DBA of claim 11, wherein the VM has a first lead connected to the terminal (VH) and a second lead connected to the multiplexer configured to select one from the reference voltages, whereby the VM is configured to measure differential voltage between a programmable reference voltage and the voltage of the battery under test.

13. The DBA of claim 1, further comprising another two terminals (IH) and (IL) connected to a circuit block for current measurement (IM).

14. A method for evaluating a battery using the DBA of claim 1, the method comprising the steps of:

using the DBA to measure a differential voltage representing a difference between a reference voltage and a voltage of a battery under test, and/or using the DBA to measure self-discharge current ($I_{sd}$) of a group of batteries.

15. The method of claim 14, wherein the DBA further comprises another two terminals (VH) and (VL) and a circuit block for voltage measurement (VM) for measuring differential voltage between the reference voltage and the voltage of the battery under test which is connected to the DBA via the terminals (VH) and (VL), and the reference voltage is determined on the basis of the voltage of the SB.

16. The method of claim 14, wherein the battery under test includes a group of batteries connected in parallel.

17. The method of claim 14, prior to the using the DBA to measure a differential voltage, the method comprising the steps of:

applying a first constant current ($I_1$) and a second constant current ($I_2$) to a battery being tested for a period of time ($dt_1$) and for the same or a different period of time ($dt_2$), respectively, with the control circuit inside the DBA, wherein the battery being tested is connected to the DBA via the terminals (IOH) and (IOL), and the currents $I_1$ and $I_2$ are low enough not to interrupt the electrochemical balance of the battery being tested, and wherein the using the DBA to measure a differential voltage comprises:

measuring a first voltage change ($dV_1$) and a second voltage change ($dV_2$) of the battery being tested over the periods of time $dt_1$ and $dt_2$, respectively, and the method further comprising the steps of:

calculating a first voltage change rate ($dV_1/dt_1$) for the period of time dt at the current $I_1$ and a second voltage change rate ($dV_2/dt_2$) for the period of time $dt_2$ at the current $I_2$;

calculating $I_{sd}$ and dynamic capacitance (DNC) of the battery being tested by solving equations (1) and (2), wherein $$\text{equation (1) is } (dV_1/dt_1)*DNC = I_1 + I_{sd}, \text{ and}$$

$$\text{equation (2) is } (dV_2/dt_2)*DNC = I_2 + I_{sd}.$$

18. The method of claim 17, wherein the DBA further comprises another two terminals (VH) and (VL) and a circuit block for voltage measurement (VM) for measuring differential voltage between a reference voltage and the voltage of the battery being tested, wherein the reference voltage is determined on the basis of the voltage of the SB, and wherein the battery being tested is further connected to the DBA via the terminals (VH) and (VL), whereby the first voltage change and the second voltage change are measured by means of the VM.

19. The method of claim 18, wherein the battery being tested includes a group of batteries connected in parallel, wherein the group of batteries is further connected to a circuit block for current measurement (IM) inside the DBA via terminals (IH) and (IL), and wherein each of the IM and the VM has a plurality of channels and each of the channels is configured to measure current or voltage of a battery.

20. An auto analyzer for evaluating batteries comprising:

a power supply; one or more processors; and one or more storage media storing instructions executable by the one or more processors, wherein the instructions, when executed, cause the auto analyzer to perform operations according to claim 17.

21. The method of claim 14, wherein the using the DBA to measure a differential voltage comprises: using the DBA to measure a first differential OCV (DOCV1) and a second differential OCV (DOCV2) against the standard battery (SB) representing a difference between the reference voltage and the voltage of the terminal (VH) at two different times T1 and T2, wherein the battery being tested is connected to the terminals (VH) and (VL), wherein the DBA further comprises a first current sensor connected to the SB in series for measuring the current through the SB and providing feedback to control an output current from the control circuit, and wherein the current through the SB is controlled to be equal to self-discharge current of the SB, whereby the voltage of the SB is kept constant at its open-circuit voltage (OCV), and the method further comprising the steps of: calculating a differential DOCV (ΔDOCV) between two differential OCVs for a period from T1 to T2 (Δt); and evaluating, on the basis of a ratio of ΔDOCV to Δt, the self-discharge status of the battery being tested.

22. The method of claim 21, wherein the battery being tested includes a group of batteries, and the method further comprising sorting the group of batteries according to the self-discharge status.

23. The method of claim 22, further comprising calculating, on the basis of known dynamic capacitance (DNC) value of one or more batteries in the group or average DNC value of the group of batteries, self-discharge current (Isd) of one or more batteries in the group.

24. The method of claim 23, wherein the average DNC value of the group of batteries is determined as a ratio of total DNC (TDNC) of the group of batteries to a number of the batteries in the group being tested, wherein the group of batteries is regarded as an equivalent battery in calculation of TDNC, wherein the DNC value of one or more batteries in the group or TDNC of the group of batteries is determined using a galvanostatic method, wherein the galvanostatic method comprises the steps of:

applying a first constant current ($I_1$) and a second constant current ($I_2$) to a battery in the group or the group of batteries being tested for a period of time ($dt_1$) and for the same or a different period of time ($dt_2$), respectively, wherein the currents $I_1$ and $I_2$ are low enough not to interrupt the electrochemical balance of the battery or the group of batteries;

measuring a first voltage change ($dV_1$) and a second voltage change ($dV_2$) of the battery or the group of batteries over the periods of time $dt_1$ and $dt_2$ respectively;

calculating a first voltage change rate ($dV_1/dt_1$) for the period of time $dt_1$ at the current $I_1$ and a second voltage change rate ($dV_2/dt_2$) for the period of time $dt_2$ at the current $I_2$;

calculating $I_{sd}$ and dynamic capacitance (DNC) of the battery being tested by solving equations (1) and (2), wherein $$\text{equation (1) is } (dV_1/dt_1)*DNC = I_1 + I_{sd}, \text{ and}$$

$$\text{equation (2) is } (dV_2/dt_2)*DNC = I_2 + I_{sd},$$

or calculating total self-discharge current $TI_{sd}$ and total dynamic capacitance (TDNC) of the group of batteries being tested by solving equations (3) and (4), wherein $$\text{equation (3) is } (dV_1/dt_1)*TDNC = I_1 + TI_{sd}, \text{ and}$$

$$\text{equation (4) is } (dV_2/dt_2)*TDNC = I_2 + TI_{sd}.$$

25. The method of claim 14, prior to the using the DBA to measure a differential voltage, the method comprising the steps of: applying a first current and a second current to a battery being tested at two different times T1 and T2, wherein a battery being tested is connected to the DBA via terminals (VH) and (VL), wherein the DBA further comprises two terminals (IH) and (IL) connected to a circuit block for current measurement (IM), wherein a sensor is connected between terminals (IH) and (IL) and connected with the battery in series for measuring the current through the battery; measuring a differential current (ΔI) representing a difference between a first measured current and a second measured current of the battery for a period from T1 to T2 by means of the IM, and wherein the using the DBA to measure a differential voltage comprises: measuring a first differential voltage and a second differential voltage representing a difference between the reference voltage and the voltage of the terminal (VH) while applying the first current and the second current respectively by means of the VM, and the method further comprising the steps of: calculating a change of differential voltage (ΔV) of the battery representing the difference between the first differential voltage and the second differential voltage for a period from T1 to T2; and calculating the DCIR of the battery being tested as equal to ΔV/ΔI.

26. The method of claim 14, wherein the using the DBA to measure self-discharge current ($I_{sd}$) of a group of batteries comprises the steps of:

using the control circuit inside the DBA to control the current through the SB to be equivalent to the current $I_{sd}$ thereof to keep the voltage of the SB constant, wherein the group of batteries are connected in parallel to the DBA via the terminals (IOH) and (IOL);

allowing enough time for the group of batteries to reach a balanced status; and measuring current through each battery, whereby the value of the self-discharge current $I_{sd}$ of each battery is determined as being equal to the value of the current passed through the battery.

27. The method of claim 26, wherein a group of batteries in parallel are connected to the DBA via the terminals (IOH) and (IOL), and the current $I_{sd}$ of the battery SB is determined using the DBA.

28. The method of claim 27, wherein the current through each battery is measured by means of a circuit block for current measurement (IM) inside the DBA, wherein the DBA further comprising:

another two terminals (IH) and (IL) connected to the IM, wherein the IM has a plurality of channels and each of the channels is configured to measure current of a battery.

29. A passive method for measuring self-discharge current ($I_{sd}$) of batteries in a group that are connected in parallel using the DBA of claim 1 comprising the steps of:

allowing enough time for a group of batteries being tested to reach balance status, and measuring current through each battery, wherein the group of batteries are connected in parallel with each other but without connecting to any power supply to keep the group of batteries in open circuit; and calculating self-discharge current of each battery ($I_{sd}$ #) from the equation: $I_{sd}$ #=$AI_{sd}$−$I_b$ #on the assumption that a difference of dynamic capacitance (DNC) of all batteries in the group can be ignored in calculation of self-discharge current and $AI_{sd}$ is known, wherein $AI_{sd}$ represents average self-discharge current of the group of batteries, and $I_b$ #represents the current through the corresponding battery #.

30. The method of claim 29, wherein the average self-discharge current of the group of batteries is determined as a ratio of total self-discharge current of the group of batteries to a number of the batteries in the group being tested, wherein the group of batteries is regarded as an equivalent battery in calculation of total self-discharge current, wherein the total self-discharge current is determined using a galvanostatic method, wherein the galvanostatic method comprising the steps of:

applying a first constant current ($I_1$) and a second constant current ($I_2$) to the group of batteries connected in parallel for a period of time ($dt_1$) and for the same or a different period of time ($dt_2$) respectively, wherein the currents $I_1$ and $I_2$ are low enough not to interrupt the electrochemical balance of the group of batteries;

measuring a first voltage change ($dV_1$) and a second voltage change ($dV_2$) of the group of batteries over the periods of time $dt_1$ and $dt_2$, respectively;

calculating a first voltage change rate ($dV_1/dt_1$) for the period of time dt at the current $I_1$ and a second voltage change rate ($dV_2/dt_2$) for the period of time $dt_2$ at the current $I_2$;

calculating total self-discharge current (TIsd) and total dynamic capacitance (TDNC) of the group of batteries being tested by solving equations (1) and (2), wherein $$\text{equation (1) is } (dV_1/dt_1)*TDNC = I_1 + I_{sd}, \text{ and}$$

$$\text{equation (2) is } (dV_2/dt_2)*TDNC = I_2 + I_{sd}.$$

31. A galvanostatic method for measuring self-discharge current ($I_{sd}$) of a battery, the method comprising the steps of:

applying a first constant current ($I_1$) and a second constant current ($I_2$) to a battery being tested for a period of time ($dt_1$) and for the same or a different period of time ($dt_2$) respectively, wherein the currents $I_1$ and $I_2$ are low enough not to interrupt the electrochemical balance of the battery being tested;

measuring a first voltage change ($dV_1$) and a second voltage change ($dV_2$) of the battery being tested over the periods of time $dt_1$ and $dt_2$, respectively;

calculating a first voltage change rate ($dV_1/dt_1$) for the period of time $dt_1$ at the current $I_1$ and a second voltage change rate ($dV_2/dt_2$) for the period of time $dt_2$ at the current $I_2$;

calculating $I_{sd}$ and dynamic capacitance (DNC) of the battery being tested by solving equations (1) and (2), wherein $$\text{equation (1) is } (dV_1/dt_1)*DNC = I_1 + I_{sd}, \text{ and}$$

$$\text{equation (2) is } (dV_2/dt_2)*DNC = I_2 + I_{sd}.$$

32. The method of claim 31, wherein the battery being tested includes a group of batteries connected in parallel.

* * * * *